United States Patent [19]

Morishita et al.

[11] Patent Number: 5,173,382

[45] Date of Patent: Dec. 22, 1992

[54] PHOTOSENSITIVE COMPOSITION CONTAINING WATER-SOLUBLE BINDER AND AROMATIC DIAZONIUM CHROMATE FORMING FLUORESCENT SCREENS EMPLOYING SAME

[75] Inventors: Hajime Morishita, Tokyo; Nobuaki Hayashi, Saitama; Saburo Nonogaki, Tokyo; Masato Ito, Kokubunji; Masahiro Nishizawa; Kiyoshi Miura, both of Mobara, all of Japan

[73] Assignee: Hitachi, Ltd., Tokyo, Japan

[21] Appl. No.: 462,589

[22] Filed: Jan. 9, 1990

[30] Foreign Application Priority Data

Jan. 30, 1989 [JP] Japan ..................... 1-17546

[51] Int. Cl.$^5$ ................ G03F 7/021; G03F 7/04; G03C 5/56; G03C 1/66
[52] U.S. Cl. ..................... 430/28; 430/23; 430/163; 430/176; 430/274; 430/289; 430/325; 430/326; 430/909; 430/962; 534/560; 534/562
[58] Field of Search ............ 430/176, 6, 23, 188, 430/289, 325, 326, 274, 163, 28, 909, 962; 534/560, 562

[56] References Cited

U.S. PATENT DOCUMENTS

| | | | |
|---|---|---|---|
| 3,649,269 | 3/1972 | Kubota | 430/23 |
| 3,778,615 | 12/1973 | Luckey | 430/6 |
| 4,273,842 | 6/1981 | Nonogaki et al. | 430/144 |
| 4,612,268 | 9/1986 | Miura | 430/23 |
| 4,748,102 | 5/1988 | Weller, Jr. | 430/258 |
| 4,920,030 | 4/1990 | Ichimura | 430/287 |

OTHER PUBLICATIONS

Research Disclosure 11654, Dec. 1973, pp. 94–99.
Kosar, Jr., Light-Sensitive Systems, J. Wiley and Sons, 1965, pp. 78–80.

Primary Examiner—Charles L. Bowers, Jr.
Assistant Examiner—Christopher G. Young
Attorney, Agent, or Firm—Fay, Sharpe, Beall, Fagan, Minnich & McKee

[57] ABSTRACT

A photosensitive composition comprising a water-soluble polymer, a dichromate and at least one aromatic diazonium salt selected from aromatic diazonium sulfates, sulfonates and chromates has high sensitivity, and a pattern having high resolution can be formed therefrom with a shortened exposure time.

7 Claims, 1 Drawing Sheet

PHOTOSENSITIVE COMPOSITION CONTAINING WATER-SOLUBLE BINDER AND AROMATIC DIAZONIUM CHROMATE FORMING FLUORESCENT SCREENS EMPLOYING SAME

This invention relates to a photosensitive composition, a method for pattern formation employing the composition, and a method of forming fluorescent screens for display devices of color picture tube, etc.

Photosensitive crosslinking photoresists comprising a water-soluble polymer and alkaline salt dichromate have long been known and used in photolithography, photoengraving, photoetching and the manufacture of screen printing plates, fluorescent screens for display devices, etc. These photoresists are described, for example, in "Kankosei Kobunshi (Photosensitive Polymer)" by Nagamatsu and Inui, pp. 89-96, (1977).

The photosensitive crosslinkage mechanism of photoresists is, however, not clear although this system has long history. It is tentatively reasoned that hexavalent chromium is reduced into trivalent chromium by the irradiation of light, and the trivalent chromium forms coordinate bonds with a water-soluble polymer thereby to insolubilize the polymer.

The following is an example of manufacturing a fluorescent screen for color picture tubes by the use of a photoresist. A poly(vinyl alcohol), surfactant, ammonium dichromate and blue-emitting fluorescent substance are mixed with water to form a slurry. Separately, a black matrix is formed on an interior surface of face plate of a color picture tube. The slurry is spin-coated thereon to form a coated film. The coated film is irradiated with UV light through a shadow mask and developed with water, thereby blue-emitting fluorescent dots are formed as the exposed portions are insolubized. Then, the same procedure is repeated for forming each of red-emitting fluorescent dots and green-emitting fluorescent dots. Filming, aluminizing and panel-baking are carried out thereafter, and the face plate portion and a funnel portion are combined and frit-baked, and an electron gun is attached to make a picture tube.

However, the above prior art has not given full consideration to, for example, larger-sized or more finely accurate color picture tubes. When the size of color picture tube is increased, the preparation of fluorescent dots encounter with problem that a long period of time is required for the light exposure since the exposure surface (coated surface) is farther away from a light source and the irradiation intensity is lowered on the exposure surface.

When fine accuracy of a color picture tube is required, it is necessary to decrease the fluorescent dot size. As is shown in FIG. 2, however, when a coated film 2 containing a fluorescent substance 3 is irradiated with light 5, light 5 is scattered by the fluorescent substance 3, and dots formed are larger in size than the diameter of a mask 1. Thus, there is a problem difficult to decrease the dot size.

Therefore, it is an object of the present invention to provide a highly photosensitive composition which permits the shortening of exposure time.

It is another object of the present invention to provide a pattern formation method using the photosensitive composition.

It is a further object of the present invention to provide a fluorescent screen formation method using the photosensitive composition.

The photosensitive composition of this invention comprises a water-soluble polymer, dichromate and at least one aromatic diazonium salt selected from the group consisting of aromatic diazonium sulfates, sulfonates and chromates.

The other photosensitive composition of this invention comprises a water-soluble polymer and an aromatic diazonium chromate.

The pattern formation method of this invention comprises a step of forming a film by applying on a substrate a coating composition of the photosensitive composition in a neutral or weakly acidic aqueous solution, a step of exposing the film with light having a desired pattern, and a step of forming the pattern by development.

The fluorescent screen formation method of this invention comprises a step of forming a film by applying on a substrate a neutral or weakly acidic aqueous suspension prepared by incorporating a fluorescent substance with the photosensitive composition, a step of exposing the film with light having a desired pattern, and a step of forming the pattern by development.

Figure 1:
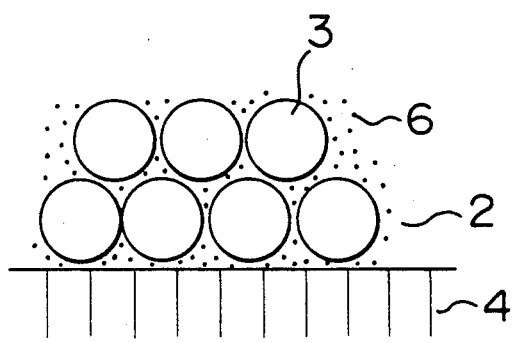
FIG. 1 is a partial cross sectional view of a picture tube face plate to explain the fluorescent screen formation method of this invention.
Figure 2:
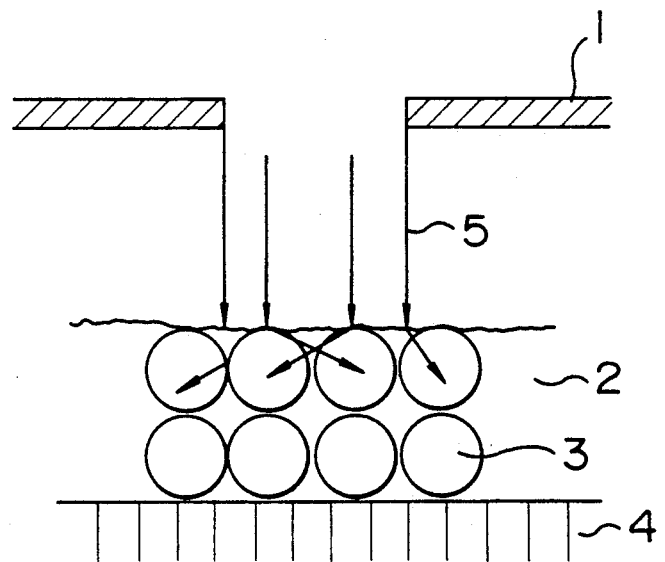
FIG. 2 is a partial cross sectional view of a picture tube face plate 4 to explain a conventional screen formation method.

The aromatic diazonium salts usable as the photosensitive composition of this invention are represented by the formula

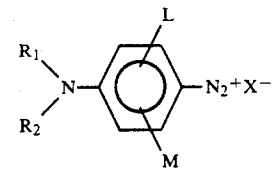

wherein $R_1$ and $R_2$ each represent an alkyl group having 1 to 3 carbon atoms, L and M each represent H, $CH_3$, $OCH_3$, $OC_2H_5$, $OC_3H_7$ or $OC_4H_9$, and X represents $HSO_4$, $CF_3SO_3$, $CH_3SO_3$ or $HCrO_4$; or by the formula

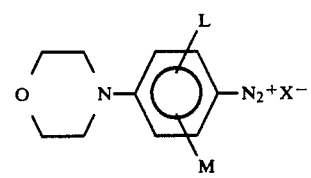

wherein L, M and X are as defined above.

Examples of organic or aromatic diazonium salts preferably usable include p-diazo-N,N-dimethylaniline sulfate, p-diazo-N,N-dimethylanilinetrifluoromethane sulfonate, p-diazo-N,N-dimethylanilinemethane sulfonate, p-diazo-morpholinobenzene sulfate, p-diazo-N,N-dimethyl-2,5-dimethylaniline sulfate, p-diazo-2,5-dimethoxymorpholinobenzene sulfate, p-diazo-N,N-dimethylaniline chromate, p-diazo-morpholinobenzene chromate, p-diazo-N,N-dimethyl-2,5-dimethylaniline chromate, p-diazo-2,5-dimethoxymorpholinobenzene chromate, etc., and they may be used in combinations.

Water-soluble polymers usable are those polymers which have been used in photosensitive compositions in combination with dichromates, and include poly(vinyl alcohol), gelatin, gum arabic, etc. When the photosensitive composition of this invention is used to form a fluoroscent screen, it is preferable to use poly(vinyl alcohol) which is easily removable by combustion.

As to the dichromate, preferably usable are alkaline salts such as alkaline metal salt, ammonium salt, etc. When the photosensitive composition of this invention is used to form a fluorescent screen, ammonium salts are preferably used.

The amount of dichromate is preferably in the range of from 5 to 20% by weight based on the water-soluble polymer. When the dichromate amount is too small, the crosslinking hardly takes place, and when it is too large, the dichromate precipitates.

The amount of aromatic diazonium salt is preferably in the range of from 5 to 20% by weight based on the water-soluble polymer. When the amount of the aromatic diazonium salt is too small, the sensitivity is not increased, and when it is too large, the salt is likely to precipitate.

The photosensitive composition of this invention may further include a surfactant, etc., which have been incorporated into conventional compositions containing a water-soluble polymer and dichromate.

When a film comprising a water-soluble polymer and dichromate is irradiated with UV light, the film becomes insoluble in water, as is reasoned that hexavalent chromium is optically reduced into trivalent chromium, and the trivalent chromium forms coordinate bonds with the water-soluble polymer to form a network structure through complicated steps.

On the other hand, when the aromatic diazonium sulfates and sulfonates are irradiated with light, they generate strong acids and reducing agents. For example, when p-diazo-N,N-dimethylaniline sulfate is irradiated with light, it decomposes and generates p-hydroxy-N,N-dimethylaniline and sulfuric acid. The former is a reducing agent, and the latter an acid.

The dichromate in an acidic state exhibits a high oxidizing power and oxidizes a reducing agent, and it in itself is reduced into trivalent chromium. It is therefore considered that when an aromatic diazonium salt is incorporated into a system containing the water-soluble polymer and dichromate, the optical reduction by light irradiation is promoted, and as the result, the photosensitivity of composition is enhanced. And, when an aromatic diazonium chromate is incorporated into a system containing the water-soluble polymer and irradiated with light, the aromatic diazonium chromate generates $HCrO_4^-$ ion and a reducing agent. For example, p-diazo-N,N-dimethylaniline chromate generates p-hydroxy-N,N-dimethylaniline as a reducing agent and $HCrO_4^-$ ion, and the former reduces the latter to trivalent chromium. The trivalent chromium forms coordinate bond with the water-soluble polymer. Further, when such a photosensitive composition is used to form a pattern, the exposure time can be shortened, and a pattern of high resolution can be obtained.

The photosensitive composition of this invention makes it possible to form a pattern and a fluorescent screen by the use of above method. The pattern formation method uses an aqueous solution having pH of 5 to 7, and the fluorescent screen formation method uses an aqueous suspension having pH of 5 to 7.

In the pattern formation method and fluorescent screen formation method of this invention, exposure time can be shortened by keeping the exposed film in a highly humid state. For example, it is preferable that films for use in the method of formating fluorescent screens are left to stand in a state having the humidity of about 50% or more for about 30 seconds to 1 minute, and more preferable to leave them in a state having the humidity of 60% or more for 30 seconds to 1 minute, although the film thickness, etc. have an influence. The humidity may be about 30%, however, it is preferable to leave them to stand for a longer period of time.

When a film of a photosensitive composition containing a fluorescent substance is irradiated with light as for formation of a fluorescent screen of a color picture tube, the light is irregularly reflected on the surface of fluorescent substance as explained previously. According to the fluorescent screen formation method of this invention, as is shown in FIG. 1, even if irradiation is effected in such an exposure amount that only the upper portion of film 2 is hardened, an acid and reducing agent 6 generated in that portion diffuse into the lower portion and insolubilize the portion while the film is left to stand in a highly humid atmosphere. Therefore, the amount of scattered light becomes small and the portion hardened by the irregular reflection of light is also reduced. Thus, dots of smaller sizes are formed.

This invention will be explained in detail by reference to non-limitative examples hereinbelow.

EXAMPLES 1-8

Photosensitive coating compositions having the following ingredients were prepared, and adjusted the pH to 7 with ammonia water.

| | |
|---|---|
| Poly(vinyl alcohol) | 5 wt. % |
| Ammonium dichromate | 0.5 wt. % |
| Aromatic diazonium salt | 0.5 wt. % |
| Water | balance |

The following were used as the aromatic diazonium salt.
(1) p-Diazo-N,N-dimethylaniline sulfate
(2) p-Diazo-morpholinobenzene sulfate
(3) p-Diazo-N,N-dimethylanilinetrifluoromethane sulfonate
(4) p-Diazo-N,N-dimethylanilinemethane sulfonate
(5) p-Diazo-2,5-dimethyl-N,N-dimethylaniline sulfate
(6) p-Diazo-N,N-dimethylaniline chromate
(7) p-Diazo-morpholinobenzene chromate
(8) p-Diazo-2,5-dimethyl-N,N-dimethylaniline chromate Each of the photosensitive coating composition was spin-coated on a glass plate and dried to form a film having a thickness of 0.5 to 0.7 μm. The resultant film was irradiated with UV light having the main emission wavelength of 365 nm for 60 seconds through a step tablet (filter) having the density difference changed stepwise by 5%. The irradiated film was left to stand under atmosphere having relative humidity of 60 to 70% for 1 minute, and then developed with warm water spray. With increasing sensitivity of a film, insolubilization took place even at a step of high filter density (step of low transmittance). Table 1 shows comparison of the sensitivities. The comparative Example stands for a film containing no aromatic diazonium salt.

TABLE 1

| Example No. | Sensitivity |
|---|---|
| 1 | 4.4 |
| 2 | 2.2 |
| 3 | 2.1 |
| 4 | 1.7 |
| 5 | 2.1 |
| 6 | 4.4 |
| 7 | 2.2 |
| 8 | 2.1 |
| Comparative | 1 |

EXAMPLES 9-11

Photosensitive coating compositions having the following ingredients were prepared, and adjusted the pH to 6-7 with ammonia water.

| | |
|---|---|
| Poly(vinyl alcohol) | 2 wt. % |
| Organic Aromatic diazonium chromate | 0.25 wt. % |
| Water | balance |

The following were used as the aromatic diazonium chromate.
(9) p-Diazo-N,N-dimethylaniline chromate
(10) p-Diazo-morpholinobenzene chromate
(11) p-Diazo-3-methyl-N,N-diethylaniline chromate The comparative example stands for a film containing 0.12 wt.% of ammonium dichromate instead of the aromatic diazonium chromate. These samples were arranged to contain in the composition the same concentration of hexavalent chromium, since ammonium dichromate has two hexavalent chromiums.

The coating composition was spin-coated on a glass plate, and the resultant film was irradiated and developed in the same conditions as in Example 1. Table 2 shows the sensitivity.

TABLE 2

| Example No. | Sensitivity |
|---|---|
| 9 | 4.4 |
| 10 | 2.5 |
| 11 | 1.7 |
| Comparative | 1 |

EXAMPLES 12-13

The following coating composition for a fluorescent film was prepared. The composition was adjusted to pH 7 with ammonia water.

| | |
|---|---|
| Blue-emitting fluorescent substance (ZnS:Ag) | 25 wt. % |
| Poly(vinyl alcohol) | 2.5 wt. % |
| Ammonium dichromate | 0.25 wt. % |
| Aromatic diazonium salt | 0.25 wt. % |
| Surfactant (polyoxyethylene-polyoxypropylene ether) | 0.25 wt. % |
| Water | balance |

The followings were used as the aromatic diazonium salts.
(12) p-Diazo-N,N-dimethylaniline sulfate
(13) p-Diazo-N,N-dimethylaniline chromate The coating composition was spin-coated on a glass plate, and the resultant film was exposed and developed in the same way under the same conditions as in Example 1. Table 3 shows the sensitivity.

TABLE 3

| Example No. | Sensitivity |
|---|---|
| 12 | 3.2 |
| 13 | 3.2 |
| Comparative | 1 |

EXAMPLE 14

A black matrix was formed on an interior surface of a color picture tube face plate using the conventional manner, and the same coating composition as that of Example 6 was spin-coated thereon to form a film. The film was irradiated with UV light through a shadow mask at positions where blue-emitting fluorescent dots were to be formed, and the film was developed with warm water spray. Then, a coating composition containing a red-emitting fluorescent substance was used to form red-emitting fluorescent dots in the same way as above. Further, a coating composition containing a green-emitting fluorescent substance was used to form green-emitting fluorescent dots in the same way.

Furthermore, using the conventional method, filming, aluminizing and panel baking were carried out, and a face plate portion and a funnel portion were combined and frit-baked, and then an electron gun was attached to form a picture tube. In the above step, the formation of fluorescent dots was achieved with the exposure time shorter than that of conventional methods, and the formed fluorescent dots had high resolution.

EXAMPLES 15-24

The same photosensitive coating compositions as that of Example 1 were prepared by using the following diazonium salts.
(15) p-Diazo-N,N-diethylaniline sulfate
(16) p-Diazo-2,5-dimethoxy-N,N-dimethylaniline sulfate
(17) p-Diazo-2,5-dibutoxy-N,N-dimethylaniline sulfate
(18) p-Diazo-2,5-dimethoxymorpholinobenzene sulfate
(19) p-Diazo-2,5-dibutoxymorpholinobenzene sulfate
(20) p-Diazo-N,N-diethylaniline chromate
(21) p-Diazo-2,5-dimethoxy-N,N-dimethylaniline chromate
(22) p-Diazo-2,5-dibutoxy-N,N-dimethylaniline chromate
(23) p-Diazo-2,5-dimethoxymorpholinobenzene chromate
(24) p-Diazo-2,5-dibutoxymorpholinobenzene chromate Sensitivity of these photosensitive coating compositions were evaluated in the same way under the same conditions as in Example 1. Table 4 shows the results.

TABLE 4

| Example No. | Sensitivity |
|---|---|
| 15 | 3.5 |
| 16 | 2.1 |
| 17 | 2.0 |
| 18 | 2.0 |
| 19 | 1.7 |
| 20 | 3.5 |
| 21 | 2.1 |
| 22 | 2.0 |
| 23 | 2.0 |
| 24 | 1.7 |
| Comparative | 1 |

EXAMPLE 25

The same photosensitive coating composition as that of Example 1 was used to form a film on a glass plate in the same way, and the sensitivity of the film was evaluated in the same way under the same conditions as in Example 1, except that the leaving conditions after the exposure were changed as described in Table 5. Table 5 shows the results.

TABLE 5

| Example No. | Humidity | Time | Sensitivity |
| --- | --- | --- | --- |
| 1 | 60–70% | 1 minute | 4.4 |
| 25 | 20–30% | 1 minute | 1.8 |
| Comparative | 60–70% | 1 minute | 1 |

What is claimed is:

1. A photosensitive composition comprising in admixture a water-soluble polymer selected from the group consisting of poly (vinyl alcohol), gelatin and gum arabic, and an organic diazonium chromate present in a range of about 5–20% by weight based on the water-soluble polymer, wherein the organic diazonium chromate is an aromatic diazonium chromate which is at least one selected from p-diazo-N,N-dimethylaniline chromate, p-diazo-morpholinobenzene chromate, p-diazo-N,N-dimethyl-2,5-dimethylaniline chromate and p-diazo-2,5-dimethoxymorpholinobenzene chromate.

2. A method of forming a pattern, comprising the steps of:
    forming a film by applying on a substrate a coating composition of a neutral or weakly acidic aqueous photosensitive composition comprising in admixture a water-soluble polymer selected from the group consisting of poly(vinyl alcohol), gelatin and gum arabic, and an aromatic diazonium chromate selected from the group consisting of p-diazo-N,N-dimethylaniline chromate, p-diazo-morpholinobenzene chromate, p-diazo-N,N-dimethyl-2,5-dimethylaniline chromate and p-diazo-2,5-dimethoxymorpholinobenzene chromate; the aromatic diazonium chromate being present in a range of about 5–20% by weight based on the water-soluble polymer, exposing the coated film with light having a desired pattern; and
    forming the pattern by development.

3. A method of forming a pattern according to claim 2, wherein the neutral or weakly acidic aqueous solution has pH of 5 to 7.

4. A method of forming a pattern according to claim 2, wherein the step of exposing the coated film is followed by a step of keeping the exposed film in a highly-humid atmosphere.

5. A method of forming a fluorescent screen, comprising the steps of:
    forming a film by applying on a substrate a coating composition of a neutral or weakly acidic aqueous suspension prepared by incorporating a fluorescent substance with a photosensitive composition comprising in admixture a water-soluble polymer selected from the group consisting of poly(vinyl alcohol), gelatin and gum arabic, and an aromatic diazonium chromate selected from the group consisting of p-diazo-N,N-dimethylaniline chromate, p-diazo-morpholinobenzene chromate, p-diazo-N,N-dimethyl-2,5-dimethylaniline chromate and p-diazo-2,5-dimethoxymorpholinobenzene chromate being, the aromatic diazonium chromate present in a range of about 5–20% by weight based on the water-soluble polymer;
    exposing the film with light having a desired pattern; and
    forming the pattern by development.

6. A method according to claim 5, wherein the neutral or weakly acidic suspension has a pH of 5 to 7.

7. A method according to claim 5, wherein the step of exposing the film is followed by a step of keeping the exposed film in a highly-humid atmosphere.

* * * * *

UNITED STATES PATENT AND TRADEMARK OFFICE
CERTIFICATE OF CORRECTION

PATENT NO. : 5,173,382
DATED : December 22, 1992
INVENTOR(S) : Hajime Morishita, et. al.

It is certified that error appears in the above-indentified patent and that said Letters Patent is hereby corrected as shown below:

On the Title page, item [54], the Title should read as follows:

PHOTOSENSITIVE COMPOSITION CONTAINING
WATER-SOLUBLE BINDER AND AROMATIC
DIAZONIUM CHROMATE AND METHOD FOR
FORMING FLUORESCENT SCREENS EMPLOYING
SAME

Signed and Sealed this

Nineteenth Day of October, 1993

Attest:

BRUCE LEHMAN

*Attesting Officer*    *Commissioner of Patents and Trademarks*